(12) United States Patent
Lee

(10) Patent No.: US 6,835,894 B2
(45) Date of Patent: Dec. 28, 2004

(54) BACK PLANE STRUCTURE FOR SCSI

(75) Inventor: Chun Liang Lee, Taipei (TW)

(73) Assignee: Inventec Corporation, Taipei (TW)

( * ) Notice: Subject to any disclaimer, the term of this patent is extended or adjusted under 35 U.S.C. 154(b) by 297 days.

(21) Appl. No.: 10/179,292

(22) Filed: Jun. 26, 2002

(65) Prior Publication Data

US 2004/0001328 A1 Jan. 1, 2004

(51) Int. Cl.⁷ .............................................. H05K 7/06
(52) U.S. Cl. ....................... 174/250; 174/252; 174/261
(58) Field of Search ................................ 361/687, 788, 361/792–796; 174/252, 250, 261; 710/301; 439/61, 65, 498, 581

(56) References Cited

U.S. PATENT DOCUMENTS 4,237,546 A * 12/1980 Wells ......................... 710/100
5,536,176 A * 7/1996 Borchew et al. ............... 439/61
5,680,295 A * 10/1997 Le et al. ....................... 361/695
6,078,979 A * 6/2000 Li et al. ....................... 710/312
6,091,609 A * 7/2000 Hutson et al. ............... 361/794
6,434,499 B1 * 8/2002 Ulrich et al. ................ 702/115
2002/0014351 A1 * 2/2002 Okada et al. ................ 174/252

* cited by examiner

Primary Examiner—John B. Vigushin
(74) Attorney, Agent, or Firm—Jacobson Holman PLLC

(57) ABSTRACT

A back plane structure for SCSI used in server or array storing machine comprises a plate member including two stacked layers of PCB and an opening therethrough for fluid communication with the outside, at least two connectors on the plate member that are in electrical connection therewith for obtaining power for normal operation, and a plurality of cables respectively interconnecting the connectors. With the provision of an opening, the invention can sufficiently dissipate heat accumulated in the server during operation.

5 Claims, 2 Drawing Sheets

BACK PLANE STRUCTURE FOR SCSI

BACKGROUND OF THE INVENTION

1. Field of Invention

The invention relates to back plane structure for SCSI, and more particularly to such a back plane structure for SCSI with improved characteristics.

2. Related Art

In conventional network systems, servers provide specific services (e.g., database, file storage, printing, e-mails, web pages, etc.) for a plurality of terminals. As such, servers must be capable of processing requests sent from the terminals. In this regard, a plurality of I/O ports (i.e., hardware) is required for the server to receive information sent from the terminals. As for software, the server must be capable of managing information sent from the terminals.

Typically, a plurality of independent systems and SCSIs (Small Computer System Interfaces) are formed on the servers because the servers have to provide services to the terminals. An SCSI is defined as a means for connecting various computer peripherals to an expanded bus. The SCSI can share the load of the CPU, improve data transmission performance, and increasing the transmission speed as compared with other interfaces. Hence, an SCSI is conventionally installed in the server or workstation for serving as an interface of the hard disk or other storage devices.

An SCSI employed in the server is typically equipped with an SCSI back plane having a plurality of I/O ports. In a typical construction, the back plane is comprised of four layers of PCB (Printed Circuit Board) at least. Also, in designing the layout of each layer of PCB synchronic signal transmission must be considered so as to correctly transmit signals to an independent system in the server. This is very expensive. Furthermore, the back plane layout is relatively difficult. Heat dissipation is poor because the SCSI back plane blocks a fluid communication passage from the server to the outside. One proposed solution for achieving good heat dissipation (i.e., forming a free fluid communication passage from the server to the outside) is to form a plurality of holes on the back plane. However, this must avoid interfering with the layout of the PCBs. Hence, such a proposed solution is unachievable.

Thus, it is desirable to provide an improved back plane structure for SCSI in order to overcome the above drawbacks of the prior art.

SUMMARY OF THE INVENTION

The object of the invention to provide a back plane structure for SCSI so as to effectively solve the problem of poor heat dissipation as experienced in the prior art.

The advantages of the invention are realized by providing a back plane structure for SCSI used in server or array storing machine, the structure comprising a plate member including two stacked layers of PCB and an opening therethrough for fluid communication with the outside, at least two connectors on the plate member and in electrical connection therewith for obtaining power for normal operation; and a plurality of cables respectively interconnecting the connectors such that signals are transmitted from cables to the connectors and vice versa. Power is supplied by the plate member. Air in the server is in fluid communication with the outside through the opening. As a result, heat dissipation of the server is good. Additionally, no layout scheme is implemented on the back plane, resulting in reduced time for testing the yield of the layout in the back plane. Thus, the invention can greatly reduce the cost and difficulty of manufacturing back planes.

The different embodiments of the connector are that the connector has either 68 pins or 80 pins.

Also the connector is a hard disk connector.

And the different embodiments of the connection between the cables and the connectors are either fixedly or removably connected.

Further more, the cables are formed as an SCSI bus.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

Figure 1:
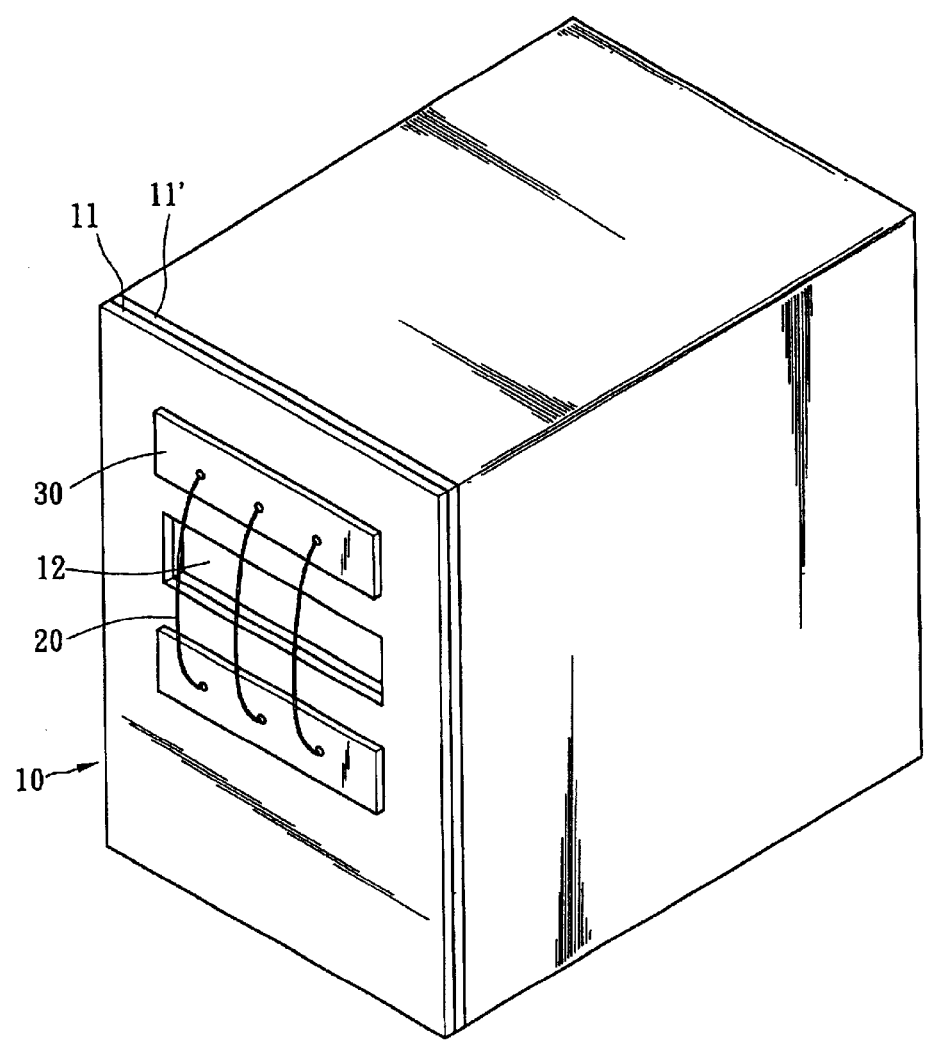
FIG. 1 is a perspective view of a first preferred embodiment of the back plane structure for the SCSI according to the invention.

Referring to FIG. 1, the SCSI back plane used in server and array storing machine comprises a plate member 10, a plurality of cables 20, and a pair of connectors 30. Each of above components is described in detail below. The plate member 10 comprises two stacked layers of PCB 11 and 11' and an opening 12 through the plate member 10 for heat dissipation. The plurality of cables 20 respectively interconnects the pair of connectors 30. Each connector 30 is disposed on the plate member 10 and is in electrical connection therewith so as to obtain power for normal operation. The connector 30 has either 68 pins or 80 pins. In this embodiment, the connector 30 is a hard disk connector.

The connection between the plurality of cables 20 and the pair of connectors 30 may be either fixed or removable depending on its application. Moreover, the size of the opening 12 cannot exceed a predetermined area, i.e., it cannot occupy an area such that it degrades the structural support of the plurality of cables 20 and the pair of connectors 30 on the plate member 10. Signals are transmitted from the plurality of cables 20 to the pair of connectors 30 and vice versa. Also, power is supplied by the plate member 10. Air in the server is in fluid communication with the outside through the opening 12. As a result, heat dissipation of the server is good. Additionally, no layout scheme is implemented on the back plane, resulting in reduced time for testing the yield of the layout in the back plane. Thus, the invention can greatly reduce the cost and difficulty of manufacturing back planes.

Figure 2:
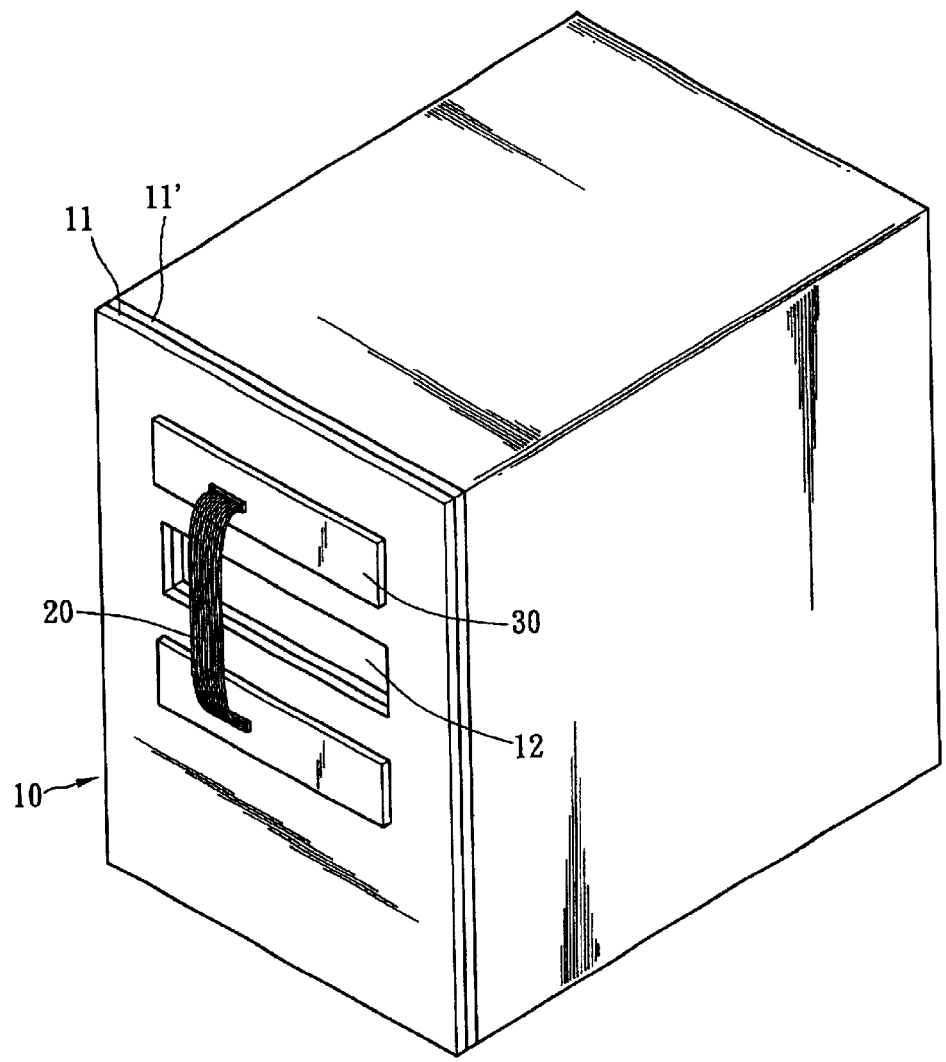
FIG. 2 is a perspective view of a second preferred embodiment of the back plane structure for the SCSI according to the invention.

Referring to FIG. 2, which shows the second preferred embodiment of the invention, the SCSI back plane used in server and array storing machine comprises a plate member 10, a plurality of cables 20, and a pair of connectors 30. The plate member 10 comprises two stacked layers of PCB 11 and 11' and an opening 12 through the plate member 10 for heat dissipation. The plurality of cables 20 is implemented as an SCSI bus. Also, either end of the plurality of cables 20 is removably coupled to one of the connectors 30. Each connector 30 is disposed on the plate member 10 and is in electrical connection therewith so as to obtain power for normal operation. The connector 30 has either 68 pins or 80 pins. In this embodiment, the connector 30 is a hard disk connector. Moreover, the size of the opening 12 cannot exceed a predetermined area, i.e., it cannot occupy an area such that it degrades the structural support of the plurality of cables 20 and the pair of connectors 30 on the plate member 10. Likewise, signals are transmitted from the plurality of cables 20 to the pair of connectors 30 and vice versa. Also, power is supplied by the plate member 10. The second embodiment has the same advantages as the first embodiment: good heat dissipation, reduced time for testing the yield of the layout in the back plane, and reduced cost and difficulty in manufacturing the back planes.

The benefits of the invention include: a bus is employed to replace the layout scheme, thus reducing the cost and difficulty in manufacturing the back planes. Furthermore, the provision of an opening through the plate member can sufficiently dissipate heat accumulated in the server.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A back plane structure for SCSI used in server and array storing machine, the structure comprising:
    a plate member including two stacked layers of PCB and an opening therethrough;
    at least two connectors on the plate member and in electrical connection therewith so as to obtain a power therefrom for normal operation; and
    a plurality of cables respectively interconnecting the connectors for signal communication;
    wherein the plurality of cables and the connectors are fixedly connected.

2. The back plane structure of claim 1, wherein the connector has 68 pins.

3. The back plane structure of claim 1, wherein the connector has 80 pins.

4. The back plane structure of claim 1, wherein the connector is a hard disk connector.

5. The back plane structure of claim 1, wherein the plurality of cables is formed as an SCSI bus.

* * * * *